United States Patent
Laemmle et al.

(10) Patent No.: US 9,865,788 B2
(45) Date of Patent: Jan. 9, 2018

(54) THERMOELECTRIC DEVICE, IN PARTICULAR THERMOELECTRIC GENERATOR OR HEAT PUMP

(71) Applicant: Mahle Behr GmbH & Co. KG, Stuttgart (DE)

(72) Inventors: Christopher Laemmle, Stuttgart (DE); Thomas Himmer, Reichenbach (DE)

(73) Assignee: Mahle Behr GmbH & Co. KG (DE)

( * ) Notice: Subject to any disclaimer, the term of this patent is extended or adjusted under 35 U.S.C. 154(b) by 78 days.

(21) Appl. No.: 14/628,206

(22) Filed: Feb. 20, 2015

(65) Prior Publication Data
US 2016/0245556 A1 Aug. 25, 2016

(30) Foreign Application Priority Data

Feb. 21, 2014 (DE) ........................ 10 2014 203 176

(51) Int. Cl.
*F25B 21/04* (2006.01)
*H01L 35/00* (2006.01)
*F25B 21/02* (2006.01)

(52) U.S. Cl.
CPC .............. *H01L 35/00* (2013.01); *F25B 21/02* (2013.01); *F25B 2321/023* (2013.01)

(58) Field of Classification Search
CPC ................................ F25B 21/04; F25B 21/00; F25B 2313/02521; F25B 2313/02523; F25B 2313/02531; F25B 2513/02533; F25B 2321/001; F25B 2321/002; F25B 2321/003; F25B 2321/02; F25B 2321/023;
(Continued)

(56) References Cited

U.S. PATENT DOCUMENTS

2003/0214031 A1* 11/2003 Onoue ................ H01S 5/02415
257/734
2004/0177623 A1* 9/2004 Zelissen ............. B60H 1/00478
62/3.7
(Continued)

FOREIGN PATENT DOCUMENTS

DE 102006011743 A1 9/2007
DE 102007022337 A1 11/2008
(Continued)

OTHER PUBLICATIONS

English abstract for DE-102006011743.
English abstract for DE-102012208295.
German Search Report for DE-102010203176.1, dated Jan. 28, 2015.

*Primary Examiner* — Mohammad M Ali
(74) *Attorney, Agent, or Firm* — Fishman Stewart PLLC

(57) ABSTRACT

A thermoelectric device may include a housing that may have a first housing element and a second housing element. The first housing element and the second housing element may each be composed of an electrically conductive material. At least two thermoelectric elements may be arranged between the first housing element and the second housing element. The at least two thermoelectric elements may be arranged at a distance from each other and may be electrically connected via at least one conductor bridge. A first electrical insulator may be arranged between the at least two thermoelectric elements and the first housing element. A second electrical insulator may be arranged between the at least two thermoelectric elements and the second housing element.

20 Claims, 4 Drawing Sheets

(58) Field of Classification Search
CPC ....... H01L 35/303; H01L 35/30; H01L 23/38; H01L 35/04; H01L 23/58
USPC .............................................. 62/3.1, 3.2, 3.3
See application file for complete search history.

(56) References Cited

U.S. PATENT DOCUMENTS

| | | | | |
|---|---|---|---|---|
| 2004/0211190 A1* | 10/2004 | Ueki | ........................ | F25B 21/04 62/3.7 |
| 2005/0161072 A1* | 7/2005 | Esser | ...................... | H01L 35/02 136/205 |
| 2008/0230618 A1* | 9/2008 | Gawthrop | .............. | B60H 1/004 237/12.3 B |
| 2008/0245398 A1* | 10/2008 | Bell | ........................ | F02G 1/043 136/224 |
| 2008/0292874 A1 | 11/2008 | Gobl et al. | | |
| 2009/0002570 A1 | 1/2009 | Oki | | |
| 2009/0056996 A1 | 3/2009 | Kato et al. | | |
| 2010/0031988 A1* | 2/2010 | Bell | ........................ | F02G 1/043 136/200 |
| 2010/0058777 A1* | 3/2010 | Walter | ...................... | B01L 7/00 62/3.6 |
| 2010/0081191 A1* | 4/2010 | Woods | ...................... | B01L 7/52 435/303.1 |
| 2012/0297755 A1 | 11/2012 | Adldinger et al. | | |
| 2012/0304746 A1* | 12/2012 | Gerhardt | ................ | G01F 1/6845 73/61.57 |
| 2012/0312029 A1* | 12/2012 | Brehm | .................. | F24H 3/0429 62/3.3 |
| 2013/0199590 A1* | 8/2013 | Brueck | .................... | F01N 5/025 136/205 |
| 2013/0239590 A1* | 9/2013 | Quisenberry | ....... | B60H 1/00478 62/3.3 |
| 2013/0276464 A1* | 10/2013 | Chien | ...................... | G01K 7/00 62/3.3 |
| 2013/0285047 A1* | 10/2013 | Yamazaki | ........... | H01L 29/7869 257/43 |
| 2013/0305743 A1* | 11/2013 | Poelloth | .................. | H01L 35/30 62/3.3 |
| 2013/0327063 A1* | 12/2013 | Gawthrop | .............. | B60H 1/004 62/3.3 |
| 2014/0096808 A1* | 4/2014 | Moczygemba | ......... | H01L 35/32 136/205 |
| 2014/0332049 A1* | 11/2014 | Angermann | ........... | H01L 35/32 136/230 |
| 2014/0345664 A1 | 11/2014 | Meyer et al. | | |

FOREIGN PATENT DOCUMENTS

| | | |
|---|---|---|
| DE | 102009058550 A1 | 1/2011 |
| DE | 102012208295 A1 | 12/2012 |
| DE | 102012102090 A1 | 8/2013 |

* cited by examiner

THERMOELECTRIC DEVICE, IN PARTICULAR THERMOELECTRIC GENERATOR OR HEAT PUMP

CROSS-REFERENCE TO RELATED APPLICATIONS

This application claims priority to German Patent Application No. 10 2014 203 176.1, filed Feb. 21, 2014, the contents of which are hereby incorporated by reference in their entirety.

TECHNICAL FIELD

The invention relates to a thermoelectric device, in particular thermoelectric generator or heat pump, and to a motor vehicle having such a thermoelectric device.

BACKGROUND

The term "thermoelectricity" means the mutual influence of temperature and electricity and their conversion into each other. Thermoelectric materials make use of this influence in order to generate electrical energy from waste heat as thermoelectric generators, but are also used in the form of what are known as heat pumps, if electrical energy is used to transport heat from a temperature reservoir having a lower temperature to one having a higher temperature.

Precisely the latter thermoelectric heat pumps are used in vehicle technology to cool a wide variety of components such as modern lithium ion batteries, which emit waste heat in considerable amounts during operation. Such thermoelectric heat pumps can however also be used in electric vehicle as combined heating and cooling devices, for instance for the temperature control of the passenger compartment, especially as they have a much higher efficiency than for instance conventional electric resistance heaters. In motor vehicles having an internal combustion engine, thermoelectric generators can convert some of the waste heat generated in the exhaust gas during the combustion process and feed it into the on-board power supply of the motor vehicle. The waste heat that has been converted into electrical energy can thus be made useful in order to reduce the energy consumption of the motor vehicle to a functionally necessary minimum and consequently avoid unnecessary emission of exhaust gases such as $CO_2$.

The fields of use of thermoelectric devices in automotive engineering are therefore many and varied. In each of the said use scenarios, it is of critical importance that the highest possible degree of efficiency is achieved in order to convert heat into electrical energy or vice versa as effectively as possible. The use in motor vehicles furthermore results in the additional requirement of producing thermoelectric devices in compact form. Thermoelectric devices installed in vehicles are therefore often produced in a plate or layer design, the thermoelectrically active elements being arranged inside a thermally conductive housing. The housing can thus be connected thermally to a temperature reservoir of low temperature on one side, the "cold" side, and to a temperature reservoir of higher temperature on the other side, the hot side, so that the thermoelectric elements produce an electric thermovoltage owing to the temperature gradient between the two sides, which thermovoltage can be conducted out via suitable electrical connections and used. In this case the thermoelectric device follows the working principle of a thermoelectric generator. Conversely, a thermoelectric device can also be used as a heat pump for transporting heat from the cold side to the hot side by applying an external electric voltage to the said electrical connections.

Against this background, WO 2012/12006 A2 concerns a thermoelectric module having a fluid-tight, metallic housing to which a ceramic layer is applied. At least one thermoelectrically active material is arranged in the housing.

SUMMARY

The invention is based on the object of creating a thermoelectric device, in particular a thermoelectric generator or heat pump, which has improved efficiency. The invention is also based on the object of creating a motor vehicle having such a thermoelectric device.

These problems are solved by the subject matter of the independent patent claims. Preferred embodiments form the subject matter of the dependent patent claims.

The basic concept of the invention is accordingly arranging the thermoelectrically active elements of a thermoelectric device inside an electrically conductive housing, which comprises at least one first and one second housing element, each consisting of an electrically conductive material. The necessary electric coupling between the individual thermoelectrically active elements takes place by means of electrical conductor bridges, which each connect two adjacent thermoelectric elements to each other. In order then to achieve a highly effective thermal coupling of the thermoelectric elements to the housing, but also to ensure the indispensable electrical insulation between the said housing and the first housing element, the thermoelectric device according to the invention is provided with first and second electrical insulators. These are arranged between the thermoelectric elements and the first housing element or between the thermoelectric elements and the second housing element. The said first electrical insulator is connected in a materially cohesive manner both to the conductor bridges and to the first housing element; the same applies to the second electrical insulator, which accordingly is connected in a materially cohesive manner both to the conductor bridges and to the second housing element. The use of such materially cohesive connections allows thermal energy in the form of heat to be transmitted through the electrical insulation in a highly efficient manner, although the latter has electrically insulating properties.

In a particularly preferred variant, the materially cohesive connection can be a soldered connection or a sintered connection. To produce a soldered connection, the use of an active solder, which can contain a reactive component, is recommended. The term "reactive component" in the present context means a component that has a sufficiently high affinity to the material system of the electrical insulator. The use of a sintered connection, however, has also proven advantageous if the process temperature is below the working temperature.

In an embodiment that is particularly preferred from a manufacturing standpoint, it is proposed that the two housing elements each be formed as housing walls and the two electrical insulators each be formed as an insulating foil or insulating plate consisting of an electrically insulating material. This allows an implementation of the thermoelectric device in the form of a sandwich-like arrangement with a plurality of layer- or plate-like elements arranged one above the other along a layer direction, which is particularly advantageous from a design standpoint because it saves space. In other words, in this embodiment, the first housing wall, the first electric insulation plate/foil, the thermoelectric elements forming a thermoelectrically active region, including the conductor bridges, the second electrical insulation plate/foil, and the second housing wall are arranged one above the other in a layer-like manner along a layer direction. Such a layer-like arrangement also results in a particularly high degree of thermal coupling.

In an advantageous development, the first housing wall, the first insulation plate, a thermoelectrically active region defined by all the thermoelectric elements, including the conductor bridges, the second insulation plate, and also the second housing wall are each constructed in a layer-like manner and arranged one above the other along a layer direction. In this manner a particularly effective thermal coupling of the thermoelectric elements to the housing walls can be achieved. The individual thermoelectric elements can be arranged adjacently to each other and at a distance from each other substantially along a transverse direction extending transversely to the layer direction. The use of conductor bridges is recommended for the electrical connection of the individual thermoelectric elements: For instance, a thermoelectric element can be electrically connected on a first side facing the first housing wall by means of a conductor bridge to an adjacent thermoelectric element in the transverse direction; accordingly, the same thermoelectric element must be connected on a second side facing the second housing wall, likewise by means of a conductor bridge, to an adjacent thermoelectric element in the opposite direction to the transverse direction, or vice versa.

It has proven particularly expedient to select a ceramic, in particular having a high thermal conductivity, for the electrically insulating material of the insulation plates/insulation foils. The relevant person skilled in the art is familiar with a multiplicity of such commercially available ceramics having high thermal conductivity, which are suitable for thermally coupling the housing to the thermoelectric elements.

If the focus is placed on the objective of the lowest possible production costs and design flexibility in the production of the thermoelectric device according to the invention, it is recommended that the electrical insulation be produced by means of known thermal injection methods.

Alternatively to the use of ceramics, a configuration of the electrical insulation as a solder glass layer is also suitable. The main constituents of such a solder glass layer are typically boron oxide, silicon oxide, aluminium oxide and barium oxide, but the use of other suitable substances/ substance systems is also conceivable. Since both compounds are non-metals, a solder glass layer has the electrically insulating property required according to the definition.

To prevent thermomechanical stresses that act on the thermoelectric device—for instance while the vehicle is being driven—resulting in breakage of the insulation foil or insulation plate and of the individual layers arranged adjacently to them, it is proposed that the insulation foil or insulation plate be provided with a perforation extending on the layer direction, at least in the region between two adjacent thermoelectric elements in which no conductor bridge is provided. In the event that the individual layers are subjected to high mechanical stresses in the transverse direction, such a perforation follows the working principle of a predetermined breaking point, since the insulation foil or insulation plate can only be separated in the region of the perforation in the event of breakage.

The thermal coupling of the thermoelectric elements to the housing can be improved further by providing the insulation foil/insulation plates along the transverse direction substantially only in the region of a respective conductor bridge. However, in the region between two adjacent thermoelectric elements, in which an electrically insulating filler body can be arranged, the said electrical insulation in the form of an insulation foil/insulation plate can be omitted. Owing to the provision of the insulation foils/insulation plates only in some sections, expansion joins are produced in regions between two adjacent insulation foils/insulation plates, said expansion joins advantageously being able to reduce thermally induced stresses in the different layers to a considerable extent.

In order to exclude electrical short circuits between the conductor bridges and the housing, it is proposed that the length of the insulation foils/insulation plates be increased slightly compared to the conductor bridge assigned to them, so that they each project beyond the individual conductor bridges both in and counter to the transverse direction.

The individual thermoelectric elements 5 can preferably be formed from p- and n-doped materials, alternating in the transverse direction Q, and can contain one or more of the following materials:

tellurides, for example a bismuth-tellurium-based material, a lead-tellurium-based material, a silver-tellurium-based material, an antimony-based material, for example a cobalt-antimony-based material or a zinc-antimony-based material, selenides, for example PBSe, $Bi_2Se_3$, $K_2BiS_{13}$, oxides, for example $NoCoO_4$, $Ca_3CoO_9$, silicides, for example a manganese silicide, a magnesium silicide or an iron silicide-based material, or else a germanium-silicon compound, borides and carbides, for instance $B_4C$, $CaB_6$, TI compounds, for instance $TI_9BiTe_6$, Zintl phases such as Yb14MnSb11, silver compounds such as $AgPbSbTe_{2+x}$.

In order to prevent undesirable substance diffusion of the material of the thermoelectric elements into the conductor bridges and vice versa as far as possible, it is proposed in an advantageous development that a barrier layer be arranged on the first and/or second side of the thermoelectric element along the layer direction, by means of which barrier layer such undesirable diffusion effects can be prevented. The application of the barrier layer to the thermoelectric elements can be assisted by an adhesive layer, which can be provided on the side of the barrier layer that faces the housing, for materially cohesive connection of the barrier layer to the associated conductor bridge. In particular metals such as nickel, tantalum, tungsten, chromium, gold, silver, titanium or copper are suitable as the material for the barrier layers and for the adhesive layers.

The materially cohesive connection of the barrier layer to the thermoelectric elements themselves has also proven significant for high effectiveness of the barrier layer. To this end, a first adhesive layer can be provided between the barrier layer and the thermoelectric elements, whereas the connection of the barrier layer to the join layer can alternatively or additionally take place with the aid of a second adhesive layer. Finally, likewise alternatively or additionally, a third adhesive layer can also be provided on a side of the join layer that faces the respective housing wall.

For manufacturing considerations, it has proven advantageous to form each conductor bridge as a metal pad, which is attached to a side of the insulation foil/insulation plate that faces the thermoelectric element. An additional metal pad can be attached to a side of the insulation foil/insulation plate that faces away from the thermoelectric element.

Particularly stable fastening of the metal pad can be achieved by providing a join layer, by means of which the two metal pads are each fastened in a materially cohesive manner to the insulation foil/insulation plate.

In a particularly advantageous embodiment, a protective coating for protection against oxidation and/or an electrically insulating filler body can be provided along the transverse direction between two adjacent thermoelectric elements. Said filler body is used for mutual electrical insulation between two adjacent thermoelectric elements, so that they are only connected to each other in an electrically conductive manner via electric conductor bridges. The material of the filler body preferably has the lowest possible thermal conductivity.

The invention further relates to a motor vehicle having a thermoelectric device having one or more of the above-mentioned features.

Further important features and advantages of the invention can be found in the sub-claims, the drawings and the associated description of the figures using the drawings.

It is self-evident that the above-mentioned features and those still to be explained below can be used not only in the combination given in each case but also in other combinations or alone without departing from the scope of the present invention.

Preferred exemplary embodiments of the invention are shown in the drawings and are explained in more detail in the description below, the same reference symbols referring to the same or similar or functionally equivalent components.

BRIEF DESCRIPTION OF THE DRAWINGS

In the figures.

DETAILED DESCRIPTION

Figure 1A:
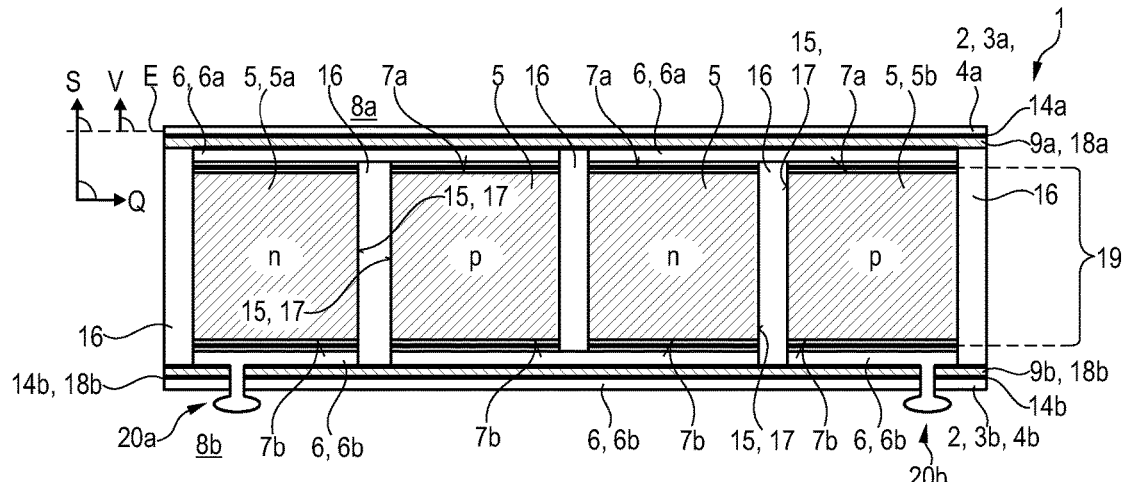
FIG. 1a schematically shows a first example of a thermoelectric device according to the invention in a roughly schematic diagram, FIG. 1b schematically shows the example of FIG. 1 in an exploded diagram, FIG. 2a/b schematically shows a first variant of the example of FIG. 1a/b, FIG. 3a/b schematically shows a second variant of the example of FIG. 1a/b, FIG. 4a/b/c schematically shows a third variant of the example of FIG. 1a/b.
Figure 1B:
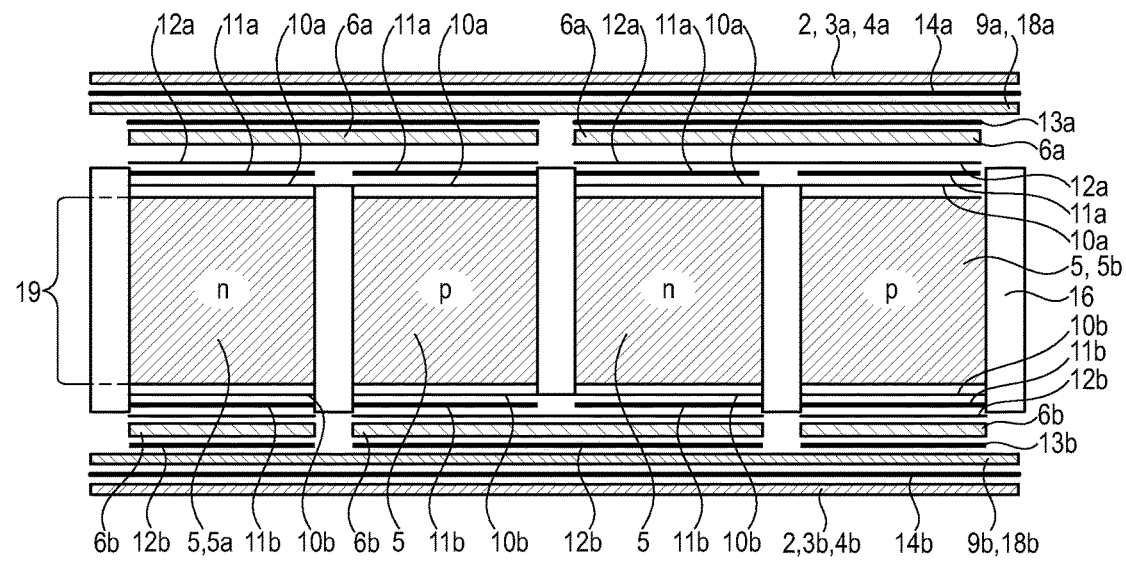

FIG. 1a illustrates a first example of a thermoelectric device 1 according to the invention in a roughly schematic diagram and in a longitudinal section. FIG. 1b shows the device 1 of FIG. 1 in an exploded diagram, so that some additional elements can be seen compared to the diagram of FIG. 1a.

The thermoelectric device 1 comprises a sufficiently dimensioned housing 2, of which only a first and second housing element 3a, 3b are shown in FIG. 1. The two housing elements 3a, 3b are produced from an electrically conductive material such as aluminium or steel and configured in the form of mutually opposite housing walls 4a, 4b. The two housing walls 4a, 4b can be completed by further, lateral housing walls (not shown in FIG. 1a) to form the housing 2, so that the housing 2 assumes the geometric shape of a shell. The housing walls 3a, 3b can be formed substantially in the manner of housing plates. Three-dimensional geometric structural elements are also expressly included in the term "housing wall".

The first housing wall 4a is in thermal contact with a hot side 8a, the second housing wall 4b is in thermal contact with a cold side 8b. Hot side 8a and cold side 8b mean two environmental regions of the thermoelectric device 1 that have different temperature levels; the temperature of the hot side 8a is consequently higher than that of the cold side 8b.

A plate plane E is defined by the two housing walls 4a, 4b. A layer direction S, which will be explained in more detail below, is defined by a direction vector V running orthogonally to the plate plane E. Four thermoelectrically active elements 5 are arranged adjacently and at a distance from each other in the region between the two housing walls 4a, 4b along a transverse direction Q, which runs orthogonally to the said layer direction S. In this connection it is clear that a different number of such elements 5 is conceivable in variants of the example. The thermoelectric elements 5 are provided on their sides 15 that face respective adjacent thermoelectric elements 5 with a protective coating 17, for example consisting of siloxane, for protection from undesirable oxidation and undesirable evaporation effects. A filler body 16 consisting of an electrically insulating material is arranged between two adjacent thermoelectric elements 5. The thermoelectric elements 5 and the filler bodies 16 alternate along the transverse direction Q. A plastic or a ceramic foam is for example considered as the material for the filler body 16. Alternatively, however, the use of an inert gas or an evacuation of the region occupied by the filler body 16 in the example is also conceivable.

The thermoelectric elements 5 arranged along the transverse direction Q are formed in the example of FIG. 1 from p- and n-doped materials alternately, and can contain one or more of the following materials:

tellurides, for example a bismuth-tellurium-based material, a lead-tellurium-based material, a silver-tellurium-based material, an antimony-based material, for example a cobalt-antimony-based material or a zinc-antimony-based material, selenides, for example PBSe, $Bi_2Se_3$, $K_2BiS_{13}$, oxides, for example $NoCoO_4$, $Ca_3CoO_9$, silicides, for example a manganese silicide, a magnesium silicide or an iron silicide-based material, or else a germanium-silicon compound, borides and carbides, for instance $B_4C$, $CaB_6$, TI compounds, for instance $TI_9BiTe_6$, Zintl phases such as Yb14MnSb11, silver compounds such as $AgPbSbTe_{2+x}$.

Any first thermoelectric element 5 is connected to its neighbour arranged in or counter to the transverse direction Q via electric conductor bridges 6, which extend along the said transverse direction Q, so that a circuit arrangement known in the field of circuit technology as an electric series circuit is produced. Alternatively, however, the individual elements 5 can also be connected in the manner of a parallel circuit.

The electrical connection to the—second—thermoelectric element 5 that is adjacent in the transverse direction Q takes place in the series circuit shown in the figures via a first conductor bridge 6a, which is fastened on a side 7a that faces the first housing wall 3a both to the first and second thermoelectric element 5 and extends between said two elements 5 along the transverse direction Q. Ideally, the conductor bridge 6a extends areally over the entire two first sides 7a of two adjacent thermoelectric elements 5. As can be seen in FIG. 1a, this applies mutatis mutandis to a second conductor bridge 6b, which is arranged on a side 7b of the first thermoelectric element 5 that faces the second housing wall 3b and is connected to a third thermoelectric element 5 that is adjacent counter to the transverse direction Q. The conductor bridge 6b also extends along the transverse direction Q between the first and second elements 5. The conductor bridges 6, 6a, 6b can be produced from copper, aluminium, chromium, nickel, silver or tin; an electrically conductive graphite foil is also conceivable. Electrical connections 20a, 20b can also be provided on the two thermoelectric elements 5a, 5b at the ends in relation to the transverse direction Q, by means of which connections the thermoelectric elements 5 can be electrically connected to an external circuit (not shown). The electrical connections 20a, 20b are produced from an electrically conductive material and can be formed as plugs, rivets, pins or the like.

In order to prevent the undesirable diffusion of material of the thermoelectric elements 5 into the conductor bridges and vice versa as far as possible, respective barrier layers 10a, 10b are provided on the first and second sides 7a, 7b of the thermoelectric elements 5 between the latter and the conductor bridges 6, 6a, 6b.

The fastening of the barrier layers 10a, 10b to the conductor bridges 6, 6a, 6b takes place with the aid of two join layers 11a, 11b (cf. FIG. 1b), which are each arranged between the barrier layers 10a, 10b and the conductor bridges 6a, 6b and can implemented in the form of sintered layers. To form the sintered layers, the use of nanosilver particles is proposed, for example. An additional adhesive layer, which cannot be seen in FIGS. 1a and 1b, can also be arranged between the barrier layers 10a, 10b and the thermoelectric elements 5. Such an additional adhesive layer can also be provided between the barrier layers 10a, 10b and the join layers 11a, 11b. Finally, such an adhesive layer—this is shown in FIG. 1b and indicated with the reference symbols 12a and 12b can also be provided between the join layers 11a, 11b and the conductor bridges 6. In particular metals such as nickel, tantalum, tungsten, chromium, gold, silver, titanium or copper are suitable as the material for the barrier layers 10, 10a and for the adhesive layers.

For the electrical insulation of the thermoelectric elements 5 and their conductor bridges 6 from the housing 2, a first electrical insulator 18a in the form of a first insulation plate 9a or alternatively in the form of an insulation foil, is applied between the first housing wall 3a and the conductor bridges 6a. A second electrical insulator 1b in the form of a second insulation plate 9b or insulation foil is analogously provided between the second housing wall 3b and the conductor bridges 6b. The insulation plates/insulation foils 9a, 9b are produced from a ceramic that has a high thermal conductivity. Aluminium oxide, zirconium oxide or magnesium oxide or else aluminium nitride or silicon nitride are considered for this. Some selected ceramics can be produced by means of a thermal injection method. Alternatively, a solder glass, which combines the properties of an insulation and a join layer, can also be used instead of a ceramic.

The first insulation plate 9a is connected in a materially cohesive manner both to the conductor bridges 6a and to the first housing wall 4a; this applies correspondingly to the second insulation plate 9b, which accordingly enters into a materially cohesive connection both with the conductor bridges 6b and with the second housing wall 4b. The use of materially cohesive connections allows thermal energy to be transmitted effectively from the thermoelectric elements 5 to the housing walls 4a, 4b or vice versa through the said insulation plates/insulation foils 9a, 9b.

The said materially cohesive connection is either a soldered connection or alternatively a sintered connection. The advantage of a sintered connection consists in the low process temperatures necessary for sintering, in particular in comparison to the production of a soldered connection, so thermally induced stresses in material having different coefficients of thermal expansion can be largely avoided. The use of a sintered connection has proven advantageous if a ceramic is used as the material system for the electrical insulation plates/insulation foils 9a, 9b as already mentioned, since said ceramic can be heated during the sintering process without the latter resulting in a change in the shape of the ceramic material.

To produce a soldered connection, the use of an active solder is recommended, which can be introduced in the form of separate soldering layers 13a, 13b, 14a, 14b between conductor bridges 6a, 6b and insulation plates/insulation foils 9a, 9b and/or between insulation plates/insulation foils 9a, 9b and housing walls 4a, 4b.

As can be seen in FIGS. 1a and 1b, the first housing wall 4a, the first insulation plate 9a, a thermoelectrically active region 19 defined by all the thermoelectric elements 5, the second insulation plate 9b, and the second housing wall 4b are each constructed in a layer-like manner and arranged one above the other along the layer direction S mentioned at the start. This allows a particularly effective thermal coupling of the thermoelectric elements 5 to the housing walls 4a, 4b and via these to the hot or cold side 8a, 8b.

Figure 2A:
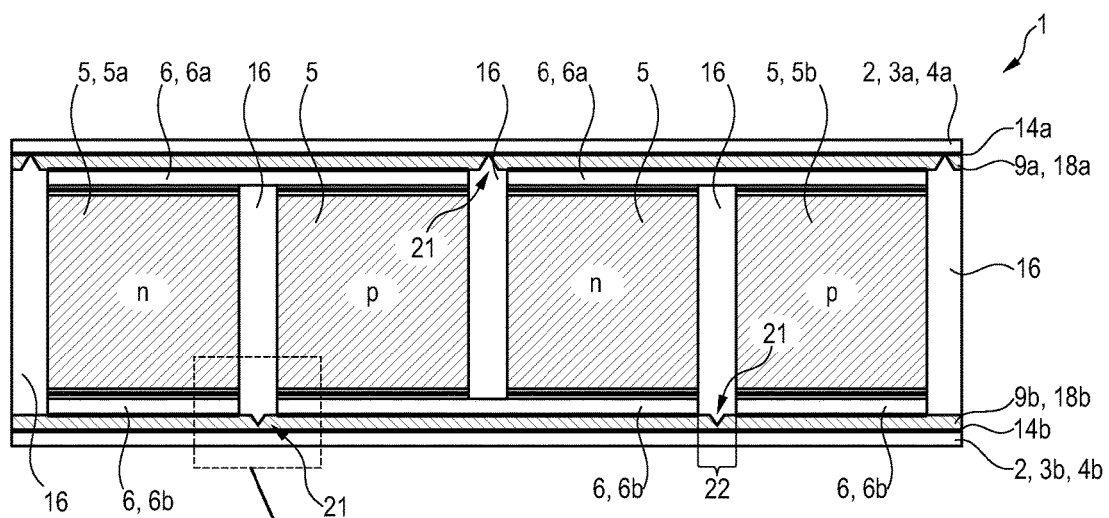
Figure 2B:
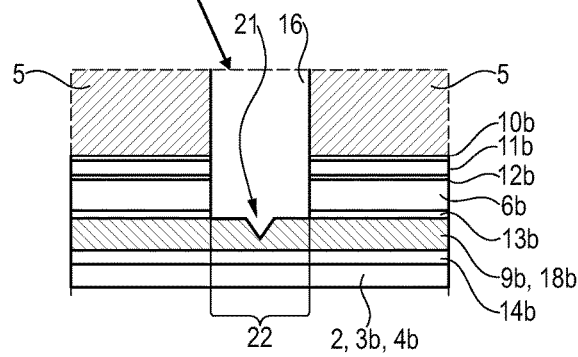

FIG. 2a shows a variant of the example of FIG. 1a/1b. In the example of FIG. 2a, the insulation plates or insulation foils 9a, 9b are provide with at least one perforation 21 in the region 22 between two adjacent thermoelectric elements 5—in which a filler material 16, but never a conductor bridge 6, 6a, 6b, is arranged in the example. The said perforation 21 can extend approximately along the layer direction S and be in the form of a recess, by means of which the thickness of the insulation plates or insulation foils 9a, 9b is locally reduced. This can be seen in the detail diagram of FIG. 2b, which shows a single perforation 21 enlarged. It is clear in this connection that a plurality of such perforations 21 can also be provided in the region between two adjacent thermoelectric elements 5, which perforations can then be arranged adjacently to each other along the transverse direction Q. In further variants, it is also possible for single such regions 22 to be provided with one or more perforations 21. The relevant person skilled in the art is presented with many different variation possibilities to choose from.

The said perforations 21 mean that thermomechanical stresses effective in the thermoelectric device 1, particularly in the transverse direction Q, can be prevented from resulting in the breakage of individual insulation plates or insulation foils 9a, 9b in the region of the conductor bridges 6, 6a, 6b. The perforations 21 therefore follow the working principle of predetermined breaking points made in a targeted manner in the insulation plates or insulation foils 9a, 9b: In the event of excessively high mechanical stresses along the transverse direction, first the insulation foil or insulation plate breaks or tears along the predetermined breaking point, whereas the conductor bridges 6, 6a, 6b necessary for the electrical connection and insulation of the thermoelectric elements 5 remain intact.

Figure 3A:
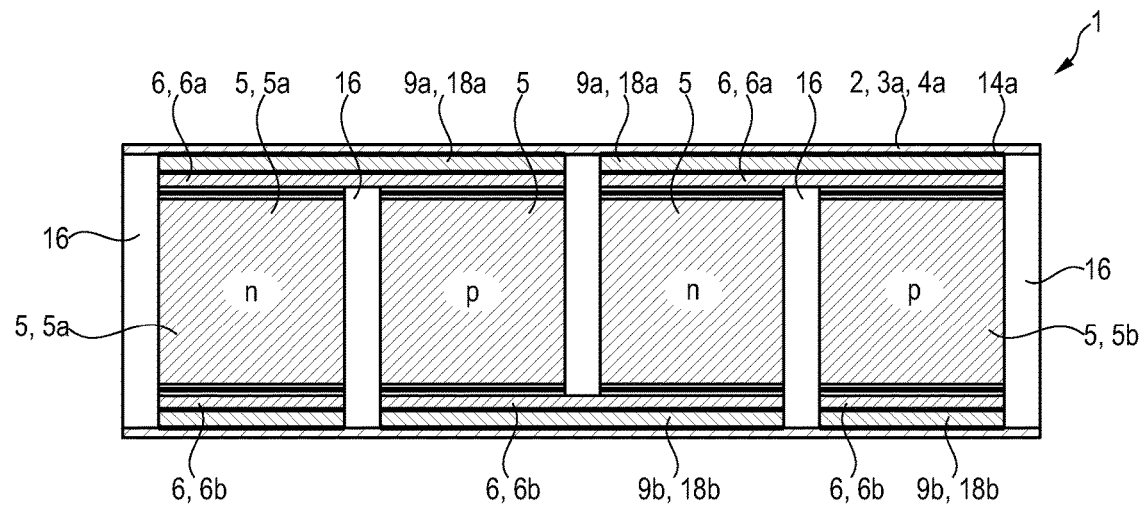

FIG. 3a/3b show a further variant of the example of FIG. 2a/2b, which can also easily be combined with the previously explained example of FIG. 2a/2b. In contrast to the example of FIG. 1a/1b, the insulation plates/insulation foils 9a, 9b in the example of FIG. 3a/3b do not extend completely along the transverse direction Q, but are only provided in some sections, in regions in which a respective conductor bridge 6, 6a, 6b is also present. The regions between adjacent thermoelectric elements 5, in which no insulation plates/insulation foils 9a, 9b are provided, fulfil the function of expansion joins, by means of which undesirable stress cracks can be prevented. In order to exclude an electric short circuit between the conductor bridges 6, 6a, 6b and the housing walls, which may impair the functioning of the thermoelectric device 1, the insulation plates/insulation foils 9a, 9b can project beyond the conductor bridges 6, 6a, 6b associated with them, both in and counter to the transverse direction Q.

Figure 3B:
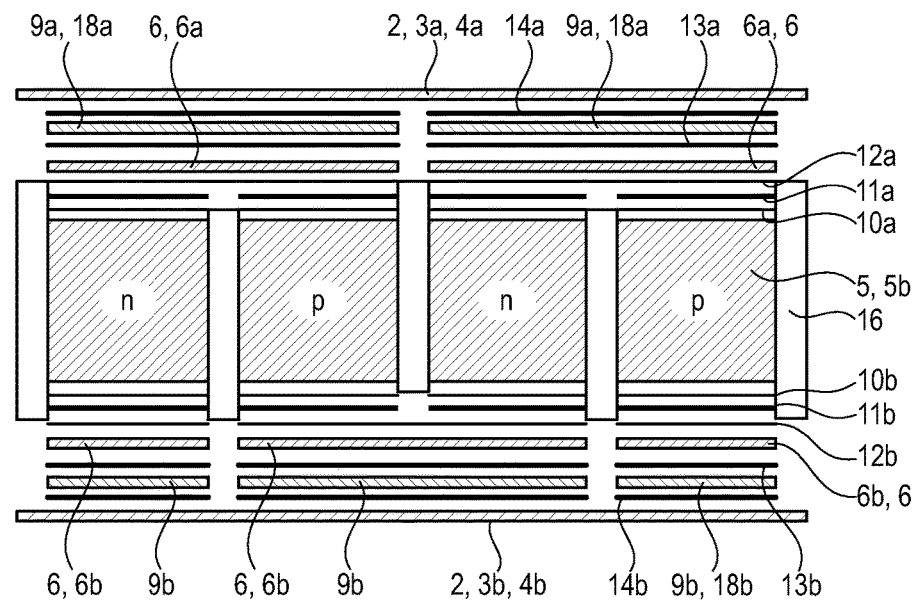
Figure 4A:
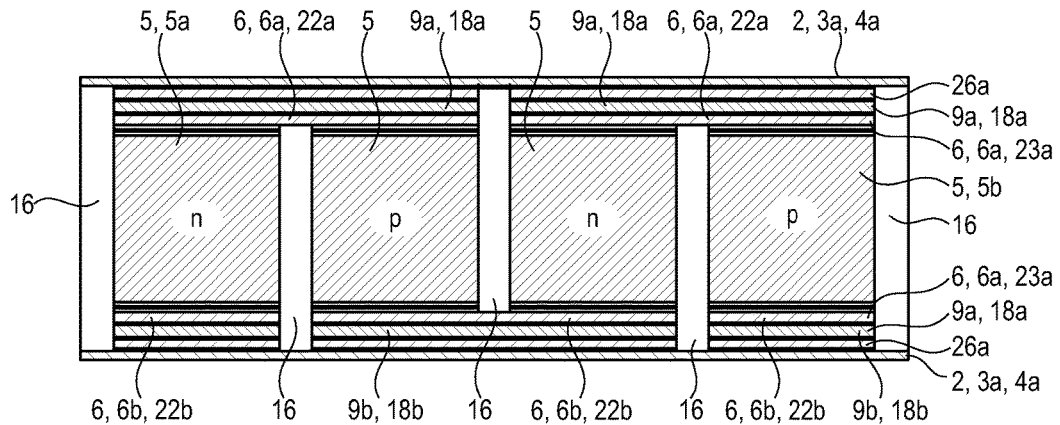
Figure 4B:
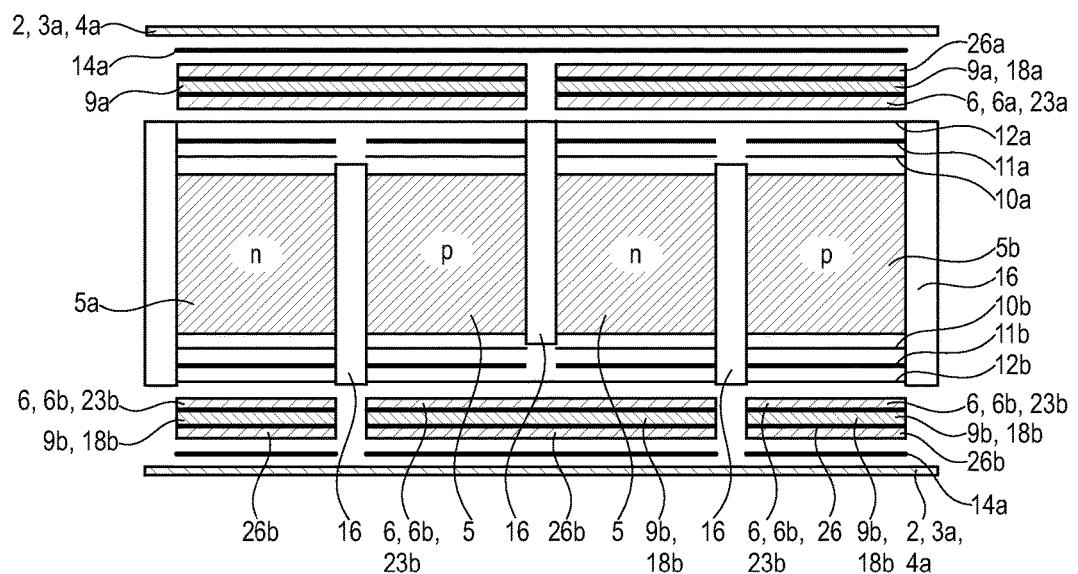
Figure 4C:
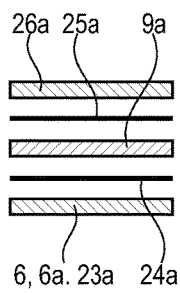

Finally, FIGS. 4a and 4b show a third variant of the example of FIG. 1—this can also be easily combined with the examples of FIGS. 2 and 3—in which the conductor bridges 6, 6a, 6b are each formed as metal pads 23a, 23b, which are attached to a side of the insulation foils/insulation plates 9a, 9b that faces the thermoelectric elements 5. This is clear from the diagram of FIG. 4c, which shows the insulation foils/insulation plates 9a, 9b shown in FIG. 4a/4b in a detail diagram. Further metal pads 26a, 26b can also be attached to a side of the insulation foils/insulation plates 9a, 9b that faces away from the thermoelectric elements 5. The metal pads 23a, 23b, 26a, 26b can be fastened to the insulation foils/insulation plates 9a, 9b with the aid of join layers 24a, 24b, 25a, 25b, which can be seen in FIG. 4c.

The invention claimed is:

1. A thermoelectric device, comprising:
    a housing including a first housing element and a second housing element, the first housing element and the second housing element each composed of an electrically conductive material,
    at least two thermoelectric elements arranged between the first housing element and the second housing element, wherein the at least two thermoelectric elements are arranged at a distance from each other and electrically connected to each other via at least one conductor bridge, and
    a first electrical insulator arranged between the at least two thermoelectric elements and the first housing element and a second electrical insulator arranged between the at least two thermoelectric elements and the second housing element,
    wherein the first electrical insulator is connected to the at least one conductor bridge and the first housing element via a materially cohesive connection, and the second electrical insulator is connected to the at least one conductor bridge and the second housing element via a materially cohesive connection.

2. The thermoelectric device according to claim 1, wherein the materially cohesive connection is at least one of a soldered connection and a sintered connection, and wherein at least the first housing element is thermally coupled to the first electrical insulator via the materially cohesive connection.

3. The thermoelectric device according to claim 1, wherein the first housing element defines a first housing wall and the second housing element defines a second housing wall; and
    wherein the first electrical insulator includes at least one of a first insulation foil and a first insulation plate composed of an electrically insulating and thermally conductive material, and the second electrical insulator includes at least one of a second insulation foil and a second insulation plate composed of an electrically insulating and thermally conductive material.

4. The thermoelectric device according to claim 3, wherein:
    the first housing wall, the first electrical insulator, a thermoelectrically active region defined by each of the at least two thermoelectric elements, the second electrical insulator, and the second housing wall are each constructed in a layer-like manner and are arranged sequentially overlaying one another along a layer direction;
    each of the at least two thermoelectric elements are arranged adjacently and at a distance from each other along a transverse direction extending transversely to the layer direction, and
    the at least one conductor bridge includes a first conductor bridge disposed on a first side of the at least two thermoelectric elements that faces the first housing wall and second conductor bridge disposed on a second side of the at least two thermoelectric elements that faces the second housing wall.

5. The thermoelectric device according to claim 1, wherein at least one of the first electrical insulator and the second electrical insulator is composed of an electrically insulating and thermally conductive ceramic.

6. The thermoelectric device according to claim 1, wherein the first electrical insulator and the second electrical insulator are produced via a thermal injection method.

7. The thermoelectric device according to claim 1, wherein at least one of the first electrical insulator and the second electrical insulator are composed of a solder glass layer.

8. The thermoelectric device according to claim 3, wherein at least one of the first electrical insulator and the second electrical insulator have at least one perforation in a region between the at least two thermoelectric elements, in which no conductor bridge is provided.

9. The thermoelectric device according to claim 3, wherein the first electrical insulator and the second electrical insulator are provided substantially only in a region of the at least one conductor bridge.

10. The thermoelectric device according to claim 3, wherein the first electrical insulator and the second electrical insulator each project beyond the at least one conductor bridge along the transverse direction.

11. The thermoelectric device according to claim 10, further comprising:
    at least one diffusion barrier layer disposed on at least one of the first side and second side of at least one of the at least two thermoelectric elements along the layer direction; and
    at least one join layer for a materially cohesive connection of the at least two thermoelectric elements to the at least one conductor bridge arranged between the barrier layer and the at least one conductor bridge.

12. The thermoelectric device according to claim 11, further comprising at least one of:
    a first adhesive layer disposed between the at least one barrier layer and the at least two thermoelectric elements on at least one of the first side and the second side of the at least two thermoelectric elements,
    a second adhesive layer disposed between the at least one barrier layer and the at least one join layer, and
    a third adhesive layer disposed on a side of the join layer that faces at least one of the first housing element and the second housing element.

13. The thermoelectric device according to claim 1, wherein:
    the at least one conductor bridge is composed of a metal pad, the metal pad attached to a first side of at least one of the first electrical insulator and the second electrical insulator facing towards the at least two thermoelectric elements, and a plurality of additional metal pads are each attached to a second side of at least one of the first electrical insulator and the second electrical insulator facing away from the at least two thermoelectric elements.

14. The thermoelectric device according to claim 13, wherein at least two metal pads are at least one of soldered and sintered via a join layer to at least one of the first electrical insulator and the second electrical insulator.

15. The thermoelectric device according to claim 1, further comprising at least one of (i) a protective coating for protecting against at least one of oxidation and evaporation and (ii) an electrically insulating filler body, wherein the at least one of the protective coating and the electrically insulating filler body are disposed along the transverse direction between the at least two thermoelectric elements.

16. A motor vehicle, comprising: at least one thermoelectric device including:
a first housing element and a second housing element respectively composed of an electrically conductive material;
at least two thermoelectric elements arranged between the first housing element and the second housing element, the at least two thermoelectric elements having a first side facing towards the first housing element and a second side facing towards the second housing element, wherein the at least two thermoelectric elements are positioned spaced from one another and electrically connected via at least one conductor bridge;
a first electrical insulator of an electrically insulating and thermally conductive material disposed at the first side between the at least two thermoelectric elements and the first housing element; and
a second electrical insulator of an electrically insulating and thermally conductive material disposed at the second side between the at least two thermoelectric elements and the second housing part;
wherein at least one of (i) the first electrical insulator is joined to the first housing element via a first materially cohesive connection, and (ii) the second electrical insulator is joined to the second housing element via a second materially cohesive connection, and wherein at least one of the first materially cohesive connection and the second materially cohesive connection includes at least one of a soldered connection and a sintered connection.

17. The motor vehicle according to claim 16, wherein the at least one thermoelectric device includes at least one of a thermoelectric generator and a heat pump.

18. A thermoelectric device for a vehicle, comprising:
a first housing element opposite a second housing element with respect to a layer direction, the first housing element and the second housing element respectively composed of an electrically conductive material;
at least two thermoelectric elements arranged between the first housing element and the second housing element, the at least two thermoelectric elements having a first side facing towards the first housing element and a second side facing towards the second housing element, wherein the at least two thermoelectric elements are positioned spaced from one another along a transverse direction extending transversely to the layer direction;
a layered arrangement disposed between the first housing element and the first side of the at least two thermoelectric elements in the layer direction, the layered arrangement including an electrical insulator of an electrically insulating and thermally conductive material and at least one conductor bridge electrically connecting the at least two thermoelectric elements, the at least one conductor bridge arranged between the at least two thermoelectric elements and the electrical insulator with respect to the layer direction; and
wherein the layered arrangement further includes a plurality of join layers respectively defining a materially cohesive connection, the plurality of join layers including a first join layer contacting the first housing element and a second join layer sandwiched between the electrical insulator and the at least one conductor bridge.

19. The thermoelectric device according to claim 18, wherein the first join layer contacting the first housing element further contacts the electrical insulator to define the materially cohesive connection between the first housing element and the electrical insulator of the layered arrangement, and wherein the materially cohesive connection defined by the first join layer and the second join layer include at least one of a soldered connection and a sintered connection.

20. The thermoelectric device according to claim 18, wherein the electrical insulator includes at least one perforation disposed in a region between the at least two thermoelectric elements, the at least one perforation extending partly through the electrical insulator in the layer direction.

* * * * *